(12) United States Patent
Wu (10) Patent No.: US 11,686,778 B1
(45) Date of Patent: Jun. 27, 2023

(54) MULTIFUNCTIONAL BATTERY HEALTH STATE DETECTION DEVICE AND SYSTEM THEREOF

(71) Applicant: Zhipeng Wu, Guangdong (CN)

(72) Inventor: Zhipeng Wu, Guangdong (CN)

( * ) Notice: Subject to any disclaimer, the term of this patent is extended or adjusted under 35 U.S.C. 154(b) by 0 days.

(21) Appl. No.: 18/078,101

(22) Filed: Dec. 9, 2022

(51) Int. Cl.
*G01R 31/00* (2006.01)
*G01R 31/392* (2019.01)
*G01R 31/36* (2020.01)
*F02N 11/08* (2006.01)
*F02N 11/12* (2006.01)

(52) U.S. Cl.
CPC ........ *G01R 31/392* (2019.01); *F02N 11/0862* (2013.01); *F02N 11/12* (2013.01); *G01R 31/3646* (2019.01)

(58) Field of Classification Search
USPC .......................................... 324/426, 432–435
See application file for complete search history.

(56) References Cited

U.S. PATENT DOCUMENTS

2016/0372946 A1* 12/2016 Menzer ............. H01M 10/4257
2022/0283239 A1*  9/2022 Kondo ................... H02J 7/0048

* cited by examiner

*Primary Examiner* — Vincent Q Nguyen (57) ABSTRACT

A multifunctional battery health state detection device is disclosed, which includes a housing, two ignition clamps for connecting to a vehicle battery; a microcontroller; a sampling circuit connected to the two ignition clamps for sampling a voltage signal of the vehicle battery; and an indicator unit including a plurality of indicators configured to display a ranking of the battery health state of the vehicle battery. The microcontroller is configured to obtain the sampled voltage signal from the sampling circuit, detect the ranking of the battery health state based on the sampled voltage signal, and control the indicator unit to display the battery health state according to the ranking of the battery health stat, and boost the vehicle battery by providing starting energy from a portable power supply to the vehicle battery in response to detecting the battery health state being one of two lowest rankings among a plurality of rankings.

17 Claims, 6 Drawing Sheets

MULTIFUNCTIONAL BATTERY HEALTH STATE DETECTION DEVICE AND SYSTEM THEREOF

TECHNICAL FIELD

This disclosure relates generally to vehicle battery detections, and more particularly relates to a multifunctional battery health state detection device and a multifunctional battery health state detection system.

BACKGROUND

When a vehicle (for example, car, motorcycle, bus, truck, etc) is boosted, it needs to use the power provided by the vehicle's own battery pack(s) to start the engine. Once the power consumption of the vehicle's own battery pack(s) reaches a certain level and the output voltage of the battery pack is low, the vehicle's battery pack(s) cannot provide enough voltage to achieve start boost, causing a failure to start the vehicle. Usually, if the voltage of the vehicle battery pack is low, the battery pack can be replaced with new battery pack(s) in order to start the vehicle normally. However, in real life, when the voltage of the battery pack is low, the drivers may not be able to find a replaceable battery pack in time. There is an emergency backup power supply device for the vehicle, which is used for temporary ignition to start boost the vehicle.

The so-called emergency backup power supply device for vehicle is a product that can be used to start boost (also known as jump start) the vehicle engine if the vehicle battery runs out of battery. At present, these products are equipped with high-rate batteries (e.g., lithium batteries) for vehicle jump starting, and are equipped with output circuits that can output large currents to boost the vehicles when the vehicle engine is coupled to these external batteries. In order to distinguish the battery clamps to be clamped on the positive and negative polarities of the vehicle battery, the two battery clamps are wrapped with insulated rubber cable (e.g., silicone wires) of different colors. The battery clamp wrapped with red insulated rubber cable is clamped on the positive polarity of the vehicle battery pack, and the battery clamp wrapped with black insulated rubber cable is clamped on the negative polarity of the vehicle battery pack.

The positive and negative polarities of the external portable power supply (e.g., battery pack(s)) are connected to ignition clamps with red and black silicone wires respectively, in order to provide backup power supply to the vehicle. The red silicone wire represents for the positive polarity of the external power supply and the black silicone wire represents for the negative polarity of the external power supply. When jump starting a vehicle by using these two ignition clamps, the positive and negative polarities of the external power supply must be correctly connected to the positive and negative polarities of the vehicle battery respectively. The large current required for jump starting the vehicle flows directly from the external power supply to the vehicle battery via the red and black silicone wires by using the vehicle ignition clamps.

The emergency backup power supply product can jump start the vehicles with low or no battery, but it is unknown from such a product why the battery is dead, what the battery status is, and whether or not the battery condition is good so that it can continue to be used, etc.

There are special-purpose battery detectors for vehicles on the market, which are usually equipped by professional repair workshops but not by ordinary vehicle owners. These battery detectors can be used to detect the health conditions of a vehicle battery. However, such detectors cannot jump start or boost a vehicle even one can tell from the detectors that the vehicle is out of battery and needs to be boosted by external power supply.

SUMMARY

In view of the above, the present invention provides a multifunctional battery health state detection device and a system thereof, in order to solve one or more of the above problems.

One of the purposes of the present invention is to provide a multifunctional battery health state detection device that is cost effective and has capability to adapt to the daily needs.

In accordance with a first aspect of the invention, a multifunctional battery health state detection device is provided. The device is configured to identify a battery health state of a vehicle battery which is classified into a plurality of rankings and comprises: a housing defining an accommodating space therein; two ignition clamps connected to the housing and configured for connecting to the vehicle battery having a positive polarity and a negative polarity; a microcontroller received in the housing; a sampling circuit connected between the two ignition clamps and the microcontroller, the sampling circuit being configured for sampling a voltage signal of the vehicle battery when the two ignition clamp are connected to the vehicle battery and sending the sampled voltage signal to the microcontroller; and an indicator unit, connected to the microcontroller, comprising a plurality of indicators configured to display a ranking of the battery health state of the vehicle battery, wherein the plurality of indicators are mounted on the housing. The microcontroller is configured to obtain the sampled voltage signal of the vehicle battery, detect which ranking of the battery health state is based on the sampled voltage signal, and control the indicator unit to display the battery health state according to the ranking of the battery health state, wherein the plurality of indicators are corresponding to the plurality of rankings respectively. The multifunctional battery health state detection device is further configured to connect to a portable power supply, and the microcontroller is configured to switch on a circuit between the portable power supply and the vehicle battery to boost the vehicle battery through the two ignition clamps in response to detecting the battery health state being one of two lowest rankings among the plurality of rankings.

In accordance with a second aspect of the invention, a multifunctional battery health state detection system is provided. The system comprises a portable power supply and a multifunctional battery health state detection device according to the first aspect of the invention.

BRIEF DESCRIPTION OF THE ACCOMPANYING DRAWINGS

These and other advantages of the present invention will be readily understood with reference to the following specifications and accompanying drawings, in which.

DETAILED DESCRIPTION OF ILLUSTRATED EMBODIMENTS

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Hereinafter, preferred embodiments of the present invention will be described with reference to the accompanying drawings. In the following description, well-known functions or constructions are not described in detail, as these may complicate the invention with unnecessary detail. For this disclosure, the following expressions and definitions will apply:

As used herein, the word "illustrative" means "serving as an example, case, or illustration." The embodiments described herein are not limiting, but rather are illustrative only. It should be understood that the described embodiments are not necessarily to be construed as preferred or advantageous over other embodiments. Furthermore, the terms "embodiments of the invention", "embodiments" or "invention" do not require that all embodiments of the invention include the feature, advantage or mode of operation discussed. The invention is set forth by the appended claims.

The terms "connected", "connected to", "connected with" "coupled", and "coupled to", "coupled with" as used herein, each means a relationship between two or more devices, appliances, files, circuits, elements, functions, operations, processes, programs, media, components, networks, systems, subsystems and/or media, which constitute any one or more of: (i) a connection, either direct or through other one or more devices, appliances, files, circuits, elements, functions, operations, processes, programs, means, components, networks, systems, subsystems or means; (ii) a communications relationship, whether direct or through other one or more devices, devices, files, circuits, elements, functions, operations, processes, programs, media, components, networks, systems, subsystems or media; and/or (iii) a functional relationship in which the operation of any one or more devices, appliances, files, circuits, elements, functions, operations, processes, programs, media, components, networks, systems, subsystems or media depends, in whole or in part, of the operation of any other one or more of them.

The terms "communicating" and "communicating" as used herein include both transmitting data from a source to a destination and delivering data to a medium, system, channel, network, device, wire, cable, fiber, circuit, and/or communication link for transmission to a destination. The term "communication", as used herein, means data transmitted or delivered in this way. The term "communications" as used herein includes one or more than one communications medium, system, channel, network, device, wire, cable, fiber, circuit, and/or link.

The term "data", as used in this document, means any signal information, indication, sign, mark, symbol, domain, set of symbols, representation and any other physical form or forms that represent information, whether permanent or temporary, whether visible, audible, acoustic, electrical, magnetic, electromagnetic or otherwise manifested. The term "data" is used to represent predetermined information in a physical form, encompassing each and every representation of the corresponding information in a different physical form or forms.

Figure 1:
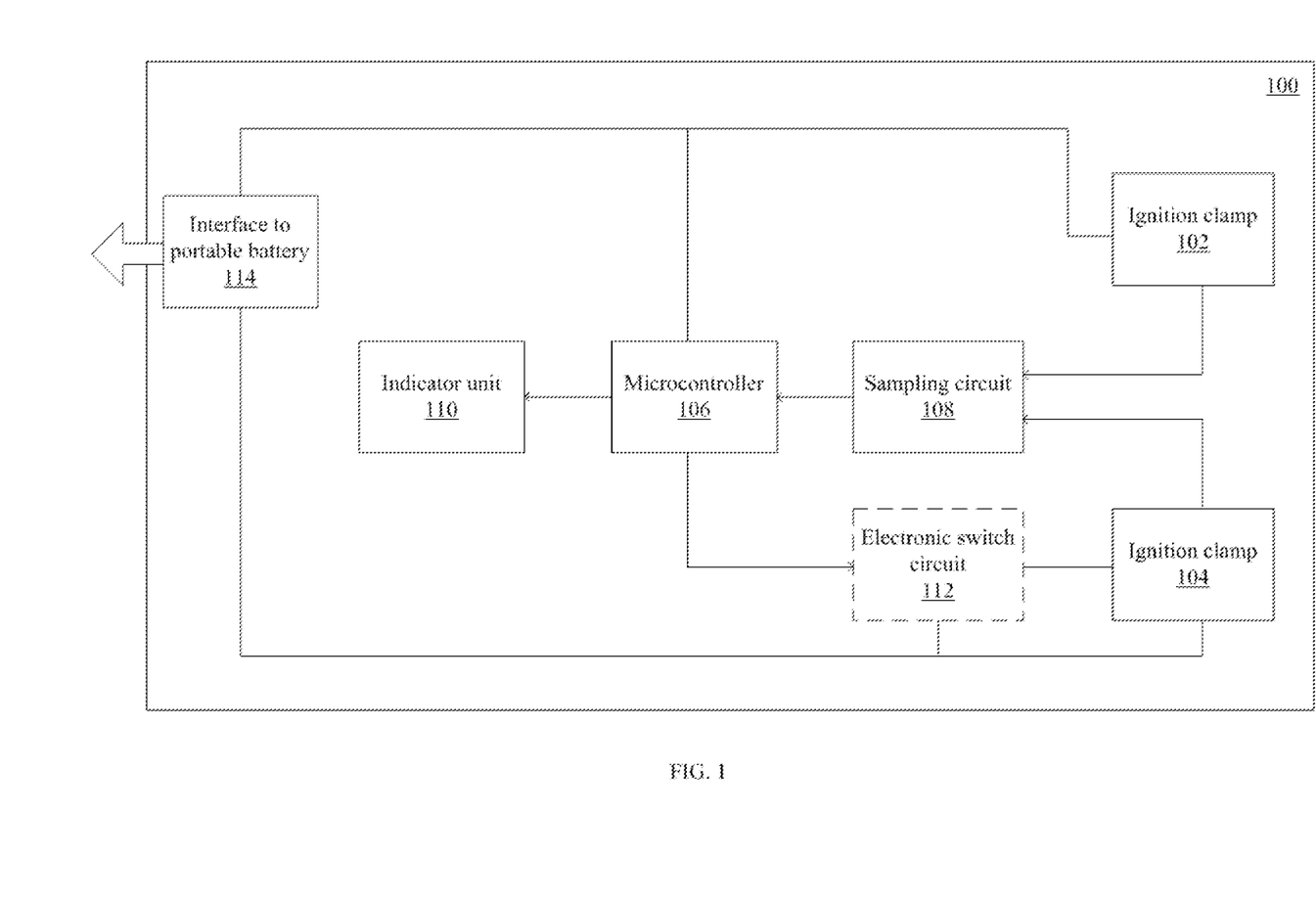
FIG. 1 illustrates a schematic diagram of a multifunctional battery health state detection device 100 in accordance with an exemplary embodiment of the invention.

FIG. 1 illustrates a schematic diagram of an example multifunctional battery health state detection device 100 in accordance with an exemplary embodiment of the invention. The multifunctional battery health state detection device 100 is configured to at least identify a battery state of a vehicle battery. As shown in FIG. 1, the multifunctional battery health state detection device 100 comprises two ignition clamps 102 and 104, a microcontroller 106, a sampling circuit 108, and an indicator unit 110. The device 100 further comprises a housing (shown as number 120 in FIG. 6) defining an accommodating space therein. The microcontroller 106 is received in the housing 120. The two ignition clamps 102 and 104 are connected to the housing 106. Each of the two ignition clamps 102 and 104 are configured for connecting to a respective one of the two terminals of a vehicle battery having a positive polarity and a negative polarity. For example, the first ignition clamp 102 could be clamped to a positive terminal of the vehicle battery, and the second ignition clamp 104 could be clamped to a negative terminal of the vehicle battery. The microcontroller 106 may be a Micro Control Unit (MCU) or a Single Chip Microcomputer. For example, the microcontroller 106 could be SONIX2711 or other models of the MCUs.

In some embodiments, the sampling circuit 108 is configured to connect between the two ignition clamps 102 and 104 and the microcontroller 106. The sampling circuit 108 is configured for sampling a voltage signal of the vehicle battery when the two ignition clamp 102 and 104 are connected to the vehicle battery and sending the sampled voltage signal to the microcontroller (106) for further process.

The microcontroller 106 is configured to obtain the sampled voltage signal of the vehicle battery from the sampling circuit 108, detect which ranking of the battery health state is based on the sampled voltage signal, and control the indicator unit 110 to display the battery health state according to the ranking of the battery health state. The battery health state of the vehicle battery could be classified into a plurality of rankings. For example, if the sampled voltage is equal to or below a certain threshold TH1, the microcontroller 106 determines the ranking of the battery health state is "Low". A "Low" ranking could be an undervoltage ranking or a depleted ranking of the vehicle battery, which means the vehicle battery is unable to perform the vehicle ignition or boost. If the sampled voltage is above the threshold TH1 and equal to or below a certain threshold TH2, the microcontroller 106 determines the ranking of the battery health state is "Middle". If the sampled voltage is above the threshold TH2 and equal to or below a certain threshold TH3, the microcontroller 106 determines the ranking of the battery health state is "Full". If the sampled voltage is above the threshold TH3 and equal to or below a certain threshold TH4, the microcontroller 106 determines the ranking of the battery health state is "Good". If the sampled voltage is above the threshold TH4 and equal to or below a certain threshold TH5, the microcontroller 106 determines the ranking of the battery health state is "MAX". In other situations, the microcontroller 106 may determine the ranking of the battery health state is "Fault". For example, if the voltage of the vehicle battery is extremely high (e.g., equal to or above a certain threshold TH6), the vehicle battery is malfunctioning, the vehicle battery is aged, vehicle engine is broken, no signal is received, battery failure, human factors, etc.

The battery health state of the vehicle battery may be classified into a plurality of rankings, depending on needs. In some embodiments, the plurality of rankings of the battery health state could comprise five rankings from a first ranking to a fifth ranking. In some embodiments, the plurality of rankings of the battery health state could comprise six rankings from a first ranking to a sixth ranking. In some embodiments, the plurality of rankings of the battery health state could comprise seven rankings from a first ranking to a seventh ranking. For examples, the battery health state may comprise six rankings from a first ranking to a sixth ranking ranging from "Low", "Middle", "Full", "Good", "MAX", and "Fault". The number of rankings could be reduced or increased to other values based on demands. Five to seven rankings in the embodiments are merely a few examples, and should not be considered as a limitation to the number of rankings of the battery health state.

Figure 6:
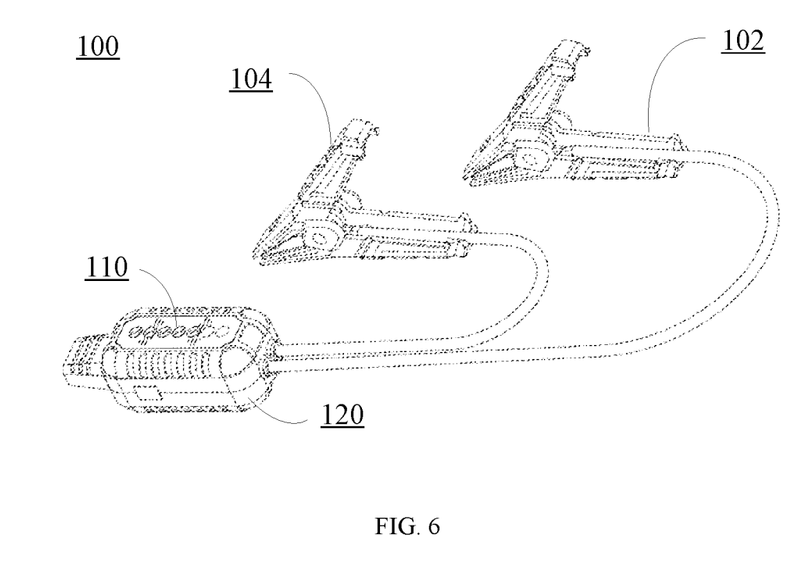
FIG. 6 is a perspective view of a multifunctional battery health state detection device 100 provided according to an exemplary embodiment of the present invention.

The indicator unit 110 is connected to the microcontroller 106 and comprises a plurality of indicators configured to display a ranking of the battery health state of the vehicle battery. The plurality of indicators are mounted on the housing 120 (as shown in FIG. 6). In some embodiments, the indicator unit 110 may comprise five indicators (e.g., indicator lights) to indicate five rankings of battery health state of the vehicle battery. In some embodiments, the indicator unit 110 may comprise six indicators (e.g., indicator lights) to indicate six rankings of battery health state of the vehicle battery. In some embodiments, the indicator unit 110 may comprise seven indicators (e.g., indicator lights) to indicate seven rankings of battery health state of the vehicle battery. In other words, the plurality of indicators may be corresponding to the plurality of rankings respectively. The number of the indicator lights could be reduced or increased to other values based on needs. Five to seven indicator lights in the embodiments are merely some examples, and should not be considered as a limitation to number of indicators for indicating the rankings of the battery health state. In some embodiments, the indicator unit 110 could be installed on the ignition clamp(s). It could also be installed on the housing surface of the device 100, as shown in FIG. 6.

In some embodiments, the indicator unit 110 includes a plurality of indicators which may be Light-Emitting Diodes (LEDs). The LED could be with a single color or could be chromatic. The display of each of the LEDs is controlled by the microcontroller 106. The microcontroller 106 may obtain the voltage of the vehicle battery and perform calculation processing, and then drive at least one of the LEDs to be turned on or off for displaying an indication on the ranking of the health state of the vehicle battery. For example, the indicator unit 110 may comprise six indicator lights (LEDs) to respectively indicate from a first ranking to a sixth ranking. LED1 may be turned on to indicate a first ranking (e.g., "Low"). LED2 may be turned on to indicate a second ranking (e.g., "Middle"). LED3 may be turned on to indicate a third ranking (e.g., "Full"). LED4 may be turned on to indicate a fourth ranking (e.g., "Good"). LED5 may be turned on to indicate a fifth ranking (e.g., "MAX"). LED6 is turned on to indicate a sixth ranking (e.g., "Fault").

In some embodiments, the multifunctional battery health state detection device 100 could comprise a display drive circuit (not shown in FIG. 1) connected to the indicator unit 110. The display drive circuit may be controlled by the microcontroller 106 to drive the ON and OFF of the indicator lights in the indicator unit 106. In some embodiments, the function of the display drive circuit could be integrated in the microcontroller 110 and implemented by the microcontroller 110 such as MCU.

Referring to FIG. 1, the multifunctional battery health state detection device 100 may be connected to a portable power supply (e.g., a portable battery) through an interface 114. In some embodiments, the microcontroller 106 is configured to switch on a circuit (not shown in FIG. 1) between the portable power supply and the vehicle battery to boost the vehicle battery (and the vehicle engine) through the two ignition clamps 102 and 104 in response to detecting the battery health state being one of two lowest rankings among the plurality of rankings. In some embodiment, the microcontroller 106 may provide an instruction so that the portable power supply is used to boost the vehicle battery when the microcontroller 106 detects the battery health state of the vehicle battery as "Low". In some embodiments, optionally, the microcontroller 106 may provide an instruction so that the portable power supply is used to boost the vehicle when the microcontroller 106 detects the battery health state of the vehicle battery as "Middle" ranking with a voltage level unable to achieve vehicle ignition by itself. Besides, if the "Middle" ranking with a voltage meets the requirement for boosting or ignition, the vehicle battery per se could be used to boost the vehicle instead of using the portable power supply. In some embodiments, if a ranking of the battery health state of the vehicle battery is equal to or above "Good", the vehicle battery is determined being in a good health state with enough remaining voltage and then the vehicle battery per se could be used to boost the vehicle battery and engine. Optionally, in this situation, the microcontroller 106 could be configured to control the portable power supply to boost the vehicle battery by providing starting energy from the portable power supply to the vehicle battery through the two ignition clamps 102 and 104. For example, one or more of the pins of the microcontroller 106 may be connected, via the interface 114, to a portable battery (e.g., lithium battery) comprising at least one battery pack. The microcontroller 106 could measure and monitor the voltage of the portable battery afterwards.

Further, the microcontroller 106 could measure and monitor the voltage of the vehicle battery or the vehicle engine. Once the voltage of the vehicle battery or the vehicle engine measured by the microcontroller 106 is determined being above a threshold (e.g., a preconfigured voltage value), the microcontroller may determine that the vehicle battery or the vehicle engine is boosted successfully. Then the microcontroller 106 provides an indication of the successful boost, for example, by means of flow water light display, flashing, buzzer sound, etc.

Upon detection of the low battery level of the vehicle battery, the users do not need to find a jump starter to assist the vehicle boosting. The device provided by the present invention can facilitate the normal vehicle use as it not only detects the battery health state of the vehicle battery, but also takes necessary actions accordingly based on the corresponding detected battery health state. For example, when it detects the battery health state is below "Middle", it may boost (or jump start) the vehicle battery.

After the multifunctional battery health state detection device is plugged into a portable starting power supply (e.g., portable power supply with lithium battery), the vehicle can be jump started directly if the vehicle battery voltage is below the required level for boosting the vehicle. The size of the device is small and the cost is reduced as well. Further, it has the capability of adapting to different daily needs as required.

In some embodiments, the multifunctional battery health state detection device 100 may comprise an electronic switch circuit 112 connected between the microcontroller 106 and the two ignition clamps 102 and 104. Specifically, the electronic switch circuit 112 could be connected to the second ignition clamp 104. The electronic switch circuit 112 could be the circuit between the portable power supply and the vehicle battery to be switched on to boost the vehicle battery. The electronic switch circuit 112 may comprise a plurality of field-effect transistors (FETs) (e.g., Metal-Oxide-Semiconductor Field-Effect Transistor (MOSFET) or Junction Field Effect Transistor (JFET)) and is configured to be turned on in response to the microcontroller 106 instructing to boost the vehicle battery via the portable power supply. When the electronic switch circuit 112 is turned on, the vehicle battery may be provided starting energy from the portable power supply via the two ignition clamps 102 and 104. The number of the FETs can be determined by the circuit current passing in the Printed Circuit Board (PCB) of the device 100, which may range from one to multiple FETs. In other embodiments, the electronic switch circuit 112 could comprise at least one relay. The number of the relays can be determined by the circuit current passing in the PCB of the device 100, which may range from one to multiple relays.

In some embodiments, the sampling circuit 108 is configured to connect to the two ignition clamps 102 and 104 for sampling an impedance signal of the vehicle battery when the two ignition clamp 102 and 104 are connected to the vehicle battery. The sampling circuit 108 is configured to connect to the microcontroller 106 for providing the sampled impedance signal to the microcontroller 106 for further process.

The microcontroller 106 is further configured to obtain the sampled impedance signal from the sampling circuit 108, and detect the battery health state of the vehicle battery based on the sampled impedance signal. In some embodiments, the microcontroller 106 may further detect a ranking of the battery health state based on the sampled impedance signal. For example, the ranking of the battery health state could be configured to indicate and distinguish a normal vehicle battery and an abnormal vehicle battery. A normal vehicle battery is in good health as to its functions; even though it has a low voltage level. There is no need to replace the low voltage vehicle battery. After being charged, it will work as usual. However, an abnormal vehicle battery is already damaged or broken, so the functions are no longer usable. A new replaceable battery must be provided instead. For example, the highest ranking could be configured to indicate the abnormal damaged state of the vehicle battery. Any one of other lower rankings could indicate the normal state.

In some embodiments, the microcontroller 106 is configured to obtain the impedance signal of the vehicle battery when detecting the battery health state being one of the two lowest rankings, and further to detect the battery health state according to the impedance signal. For example, if the ranking of the battery health state of the vehicle battery is detected as "Low" or "Middle", the microcontroller 106 may further measure the impedance of the vehicle battery. When the battery health state is detected as "Low" or "Middle", it means the voltage of the vehicle battery does not meet a required level for boosting the vehicle. However, it is unknown whether the vehicle battery is merely out of battery or whether the vehicle battery is damaged (and cannot work). If the vehicle battery is merely out of battery, it is still workable after charging and the vehicle can be boosted by a portable power supply. If the vehicle battery is damaged, the user must replace the non-workable vehicle battery with a new one. To further distinguish the battery health state when the voltage level is below a required level for boosting, the microcontroller 106 could measure the impedance of the vehicle battery.

As an example, when the impedance signal is lower than a threshold (e.g., a preconfigured impedance value), the battery health state is detected by the microcontroller 106 as in a workable state. The microcontroller 106 could give instructions to boost the vehicle battery by providing starting energy from a portable power supply to the vehicle battery through the two ignition clamps 102 and 104. In other words, the vehicle battery could be boosted successfully by external portable power supply. The workable state may be classified as multiple rankings representing normal functions.

As another example, when the impedance signal is equal or larger than the threshold, the battery health state is detected by the microcontroller 106 as in a damaged state. This means the vehicle battery cannot work since it is already damaged or broken. The user should replace the damaged vehicle battery with a new one. In some embodiments, the damaged state could be classified as a ranking of "Fault" (or "Damage", "Broken", etc) among the plurality of rankings of the battery health state. In some examples, the device 100 may comprise at least one buzzer connected to the microcontroller 106. For example, the microcontroller 106 could control the buzzer(s) to provide an alarm sound in response to the detected damaged state. The sound provided by the buzzer is controlled by the microcontroller 106. The microcontroller 106 may obtain the voltage and/or impedance of the vehicle battery and perform calculation processing, and then drive at least one of the buzzers to be turned on or off for providing warning of the health state of the vehicle battery.

In some embodiments, the microcontroller 106 is configured to detect at least one of: a temperature of the multifunctional battery health state detection device 100 when the multifunctional battery health state detection device 100 is being used or is working, and a circuit current of the multifunctional battery health state detection device 100 when the portable power supply is being used for boosting the vehicle battery. When the portable power supply is boosting the vehicle battery via the two ignition clamps, the temperature of the clamps as well as the PCB in the device 100 may reach a very high level. By monitoring the temperature, the microcontroller 106 can detect the high temperature problems in a timely manner and take necessary actions to avoid damages to the multifunctional battery health state detection device 100. In other aspects, the microcontroller 106 could monitor the circuit current of the device when it is boosting the vehicle battery. If the circuit current is too high, the microcontroller 106 can take actions immediately to prevent the device from being damaged by such a high current through the circuit board, for example by disconnecting the circuit for boosting.

In some embodiments, an electronic switch circuit 112 may be connected between the two ignition clamps 102, 104 and the microcontroller 106. The electronic switch circuit 112 may comprise a plurality of field-effect transistors (FETs) and is configured to be turned on in response to the microcontroller 106 instructing to boost the vehicle battery using the portable power supply. When at least one of the FETs of the electronic switch circuit 112 is on, the vehicle battery may be provided starting energy from the portable power supply via the two ignition clamps. The number of the FETs (e.g., MOSFET or JFET) can be determined by the current passing in the Printed Circuit Board (PCB) in the device 100, which may range from one to multiple FETs. The electronic switch circuit 112 could be the circuit between the portable power supply and the vehicle battery to be switched off to stop boosting the vehicle battery, in order to protect the PCB of the device from damage by high temperature. The electronic switch circuit 112 may be further configured to be turned off in response to the microcontroller 106 detecting at least one of: the temperature is higher than a preconfigured temperature threshold, and the circuit current is larger than a preconfigured current threshold.

The multifunctional battery health state detection device 100 may further comprise an alarm unit connected to the microcontroller (e.g., MCU) 106 and the alarm unit may comprise a buzzer. The buzzer receives instructions from the microcontroller 106 and provides alarm sound accordingly. The device may also comprise a voltage regulator circuit connected to the microcontroller 106. The voltage regulator circuit is used to stabilize the input power supply signal and send it to the microcontroller 106 to supply power to the microcontroller 106.

The multifunctional battery health state detection device 100 may comprise FETs on the circuit board that can withstand extremely high currents. The state (e.g., ON and OFF) of the FETs is controlled by the microcontroller 106. The number of the FETs (e.g., MOSFET or JFET) can be determined by the current passing in the Printed Circuit Board (PCB) of the device 100, which may range from one to multiple FETs. According to the health status of the vehicle battery detected by the device 100, the microcontroller (e.g., MCU) of the device controls the ON and OFF of the FET tubes, and sends out sound and/or light signals through the buzzer(s) and/or the LEDs to prompt/indicate/instruct whether the vehicle can be ignited and jump started. After giving an instruction to boost the vehicle, the microcontroller will measure the voltage of the vehicle battery or the vehicle engine and determine whether the boost is successful or not, and then give an indication.

Figure 2:
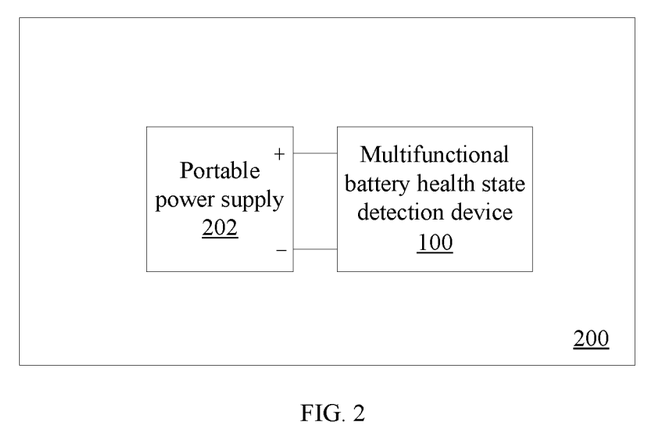
FIG. 2 illustrates a schematic diagram of a multifunctional battery health state detection system 200 for identifying a battery health state of a vehicle battery and jump-starting a vehicle engine in accordance with an exemplary embodiment of the invention.

FIG. 2 illustrates a schematic diagram of an example multifunctional battery health state detection system 200 for identifying a battery health state of a vehicle battery and jump-starting a vehicle engine in accordance with an exemplary embodiment of the invention. As shown in FIG. 2, jump starting system 200 may comprise a power supply source 202 and a multifunctional battery health state detection device 100 connected to the power supply source 202. The multifunctional battery health state detection device 100 may be the same according to the embodiments described above, which is shown in FIG. 1 and provides the same functions as described above with respect to FIG. 1. The like elements included in the multifunctional battery health state detection device 100 could apply in FIG. 2 and are identified by the same reference numbers as in FIG. 1, and thus omitted for brevity.

Figure 3:
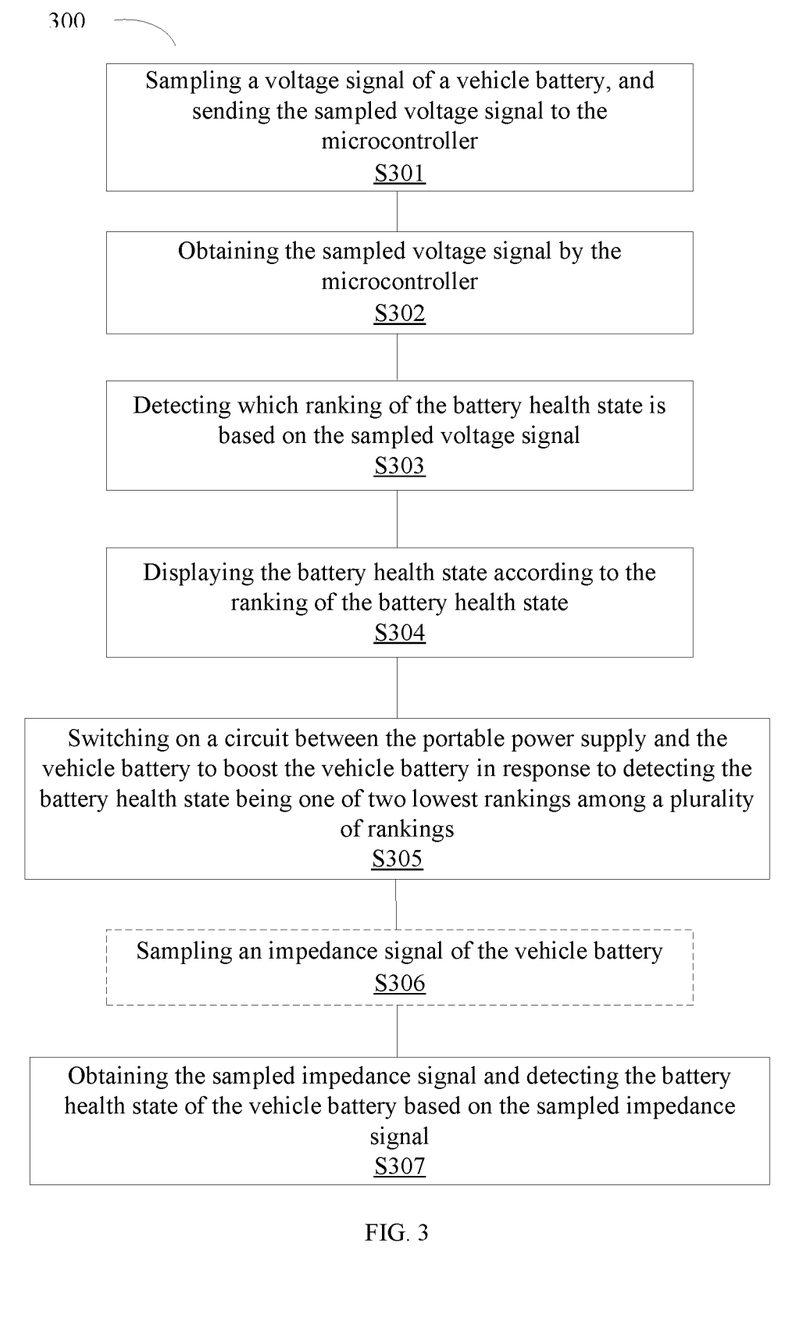
FIG. 3 is an illustrative flowchart of an exemplary embodiment of a method 300 for identifying a battery health state of a vehicle battery in accordance with the present disclosure.

FIG. 3 is an illustrative flowchart of an exemplary embodiment of a method 300 for identifying a battery health state of a vehicle battery in accordance with the present disclosure. The method 300 is performed by using the above mentioned multifunctional battery health state detection device 100. For a specific structure, a connection, and a working principle, reference can be made to the descriptions of the foregoing embodiments.

As shown in FIG. 3, the jump starting method 300 may include the following steps:

S301: sampling a voltage signal of the vehicle battery when the two ignition clamps are connected to the vehicle battery, and sending the sampled voltage signal to a microcontroller.

S302: obtaining the sampled voltage signal by the microcontroller.

S303: detecting which ranking of the battery health state is based on the sampled voltage signal.

S304: displaying the battery health state according to the ranking of the battery health state.

S305: switching on a circuit between the portable power supply and the vehicle battery to boost the vehicle battery in response to detecting the battery health state being one of two lowest rankings among a plurality of rankings.

A plurality of indicators may be corresponding to the plurality of rankings respectively for display purpose. In some embodiments, preferably, the method 300 may further comprise:

S306: sampling an impedance signal of the vehicle battery when the two ignition clamps 102 and 104 are connected to the vehicle battery.

In some embodiments, the method 300 may comprise obtaining the impedance signal of the vehicle battery when detecting the battery health state being one of the two lowest rankings.

S307: obtaining the sampled impedance signal and detecting the battery health state of the vehicle battery based on the sampled impedance signal.

In some embodiments, the method 300 may detect a ranking of the battery health state based on the sampled impedance signal. The battery health state is detected as a workable state when the impedance signal is lower than an impedance threshold, and the battery health state is detected as a damaged state when the impedance signal is equal or larger than the impedance threshold. For example, the workable state may be classified into at least one ranking (e.g., "Low", "Middle") representing normal functions among a plurality of rankings. The damaged state may be classified as a "Fault", "Damage" or "Broken" ranking of the plurality of rankings of the battery health state.

Optionally, the method 300 may control a buzzer to provide an alarm sound in response to detecting the damaged state.

Preferably, the method 300 may comprise measuring a voltage of the vehicle battery and the vehicle engine, and determine that the vehicle battery or engine is boosted successfully when the voltage measured is above a voltage threshold, and provide an indication of the successful boost, for example by means of flow water light display, flashing, buzzer sound, etc.

In some embodiments, the step of displaying the battery health state according to the ranking of the battery health state may include controlling five to seven lights to indicate five to seven rankings respectively. In an example, the battery health state may have six rankings ranging from the first ranking to the sixth ranking: "Low", "Middle", "Full", "Good", "MAX", and "Fault". In response to detection of the battery health state being the first ranking "Low", the first indicator is turned on, and the microcontroller106 sends instructions to switch on a circuit between the portable power supply and the vehicle battery to boost the vehicle battery. In response to detection of the battery health state being the second ranking "Middle", the second indicator is turned on. Optionally, the microcontroller 106 may send an instruction to switch on a circuit between the portable power supply and the vehicle battery to boost the vehicle battery from the energy of the portable power supply.

Preferably, the method 300 may comprise detect at least one of: a temperature of the multifunctional battery health state detection device when the multifunctional battery health state detection device is being used, and a circuit current of the multifunctional battery health state detection device when the portable power supply is boosting the vehicle battery.

For the details of the above steps, reference may be made to relevant descriptions of the foregoing embodiments, which will not be described in detail herein for brevity.

Figure 4:
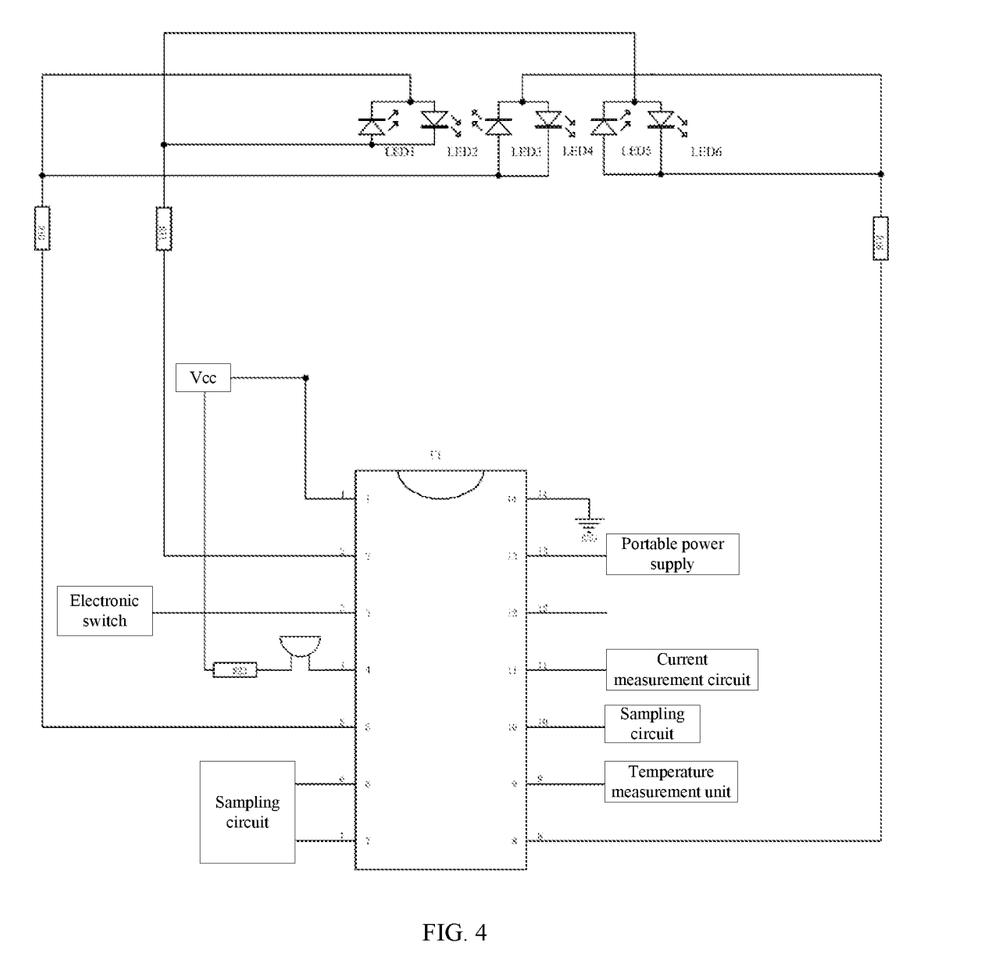
FIG. 4 is a schematic diagram showing a structure and a connection structure of the multifunctional battery health state detection device 100 in accordance with an exemplary embodiment of the invention.

FIG. 4 is a schematic diagram showing a structure and a connection structure of the multifunctional battery health state detection device 100 in accordance with an exemplary embodiment of the invention.

In some embodiments, the indicator unit may comprise six indicator lights configured to connect to three pins of the microcontroller (MCU U1 shown in FIG. 4) 106 such as pins 2, 5, and 8. The indicator lights can be Light Emitting Diodes (LEDs). As shown in FIG. 4, an anode of a first LED1 and a cathode of a second LED2 are connected to pin 2 of the microcontroller via a first resistor (R11), a cathode of the first LED1 and an anode of a second LED2 are connected to pin 5 of the microcontroller via a second resistor (R10), an anode of a third LED3 and a cathode of a fourth LED4 are connected to pin 5 of the microcontroller via the second resistor (R10), a cathode of the third LED3 and an anode of a fourth LED4 are connected to pin 8 of the microcontroller via a third resistor (R18), an anode of a fifth LED5 and a cathode of a sixth LED6 are connected to pin 8 of the microcontroller via the third resistor (R18), a cathode of the fifth LED5 and an anode of a sixth LED6 are connected to pin 2 of the microcontroller via the first resistor (R11).

The ON and OFF of the LEDs could be controlled by the microcontroller 106 by means of encoding after detection of the ranking of battery health state. The pins 2, 5, and 8 of the microcontroller 106 may give a three-digit code from "000" to "111", indicating eight different rankings of the battery health state. For example, "000" may be used to control LED1 ON, "001" may be used to control LED2 ON, "010" may be used to control LED3 ON, and so on. It should be noted that the encoding is merely an example and should not be considered as a limitation. Other ways of encoding may be used as well. For example, instead of controlling LED2, "001" could be encoded to control any other LEDs. The LEDs could be controlled to be ON in a flow water light manner to display other states of the vehicle battery. The LED could also be illuminated by flashing, flicker, blinking, etc.

When LED1 is ON, it may indicate a first ranking of the battery health state of the vehicle battery, for example, "Low". When LED2 is ON, it may indicate a second ranking of the battery health state of the vehicle battery, for example, "Middle". When LED3 is ON, it may indicate a third ranking of the battery health state of the vehicle battery, for example, "Full". When LED4 is ON, it may indicate a fourth ranking of the battery health state of the vehicle battery, for example, "Good". When LED5 is ON, it may indicate a fifth ranking of the battery health state of the vehicle battery, for example, "MAX". When LED6 is ON, it may indicate a sixth ranking of the battery health state of the vehicle battery, for example, "Fault". It should be noted that the representation of each LED is merely an example and should not be considered as a limitation. Other ways of representation may be used as well. For example, instead of using "000" to indicate the first ranking, any other encodings like "011" could also be used to indicate the first ranking of the battery health state of the vehicle battery.

Further, a buzzer may be configured to connect between a resistor R23 and pin 4 of the microcontroller 106 for providing alarm sound when needed.

Figure 5:
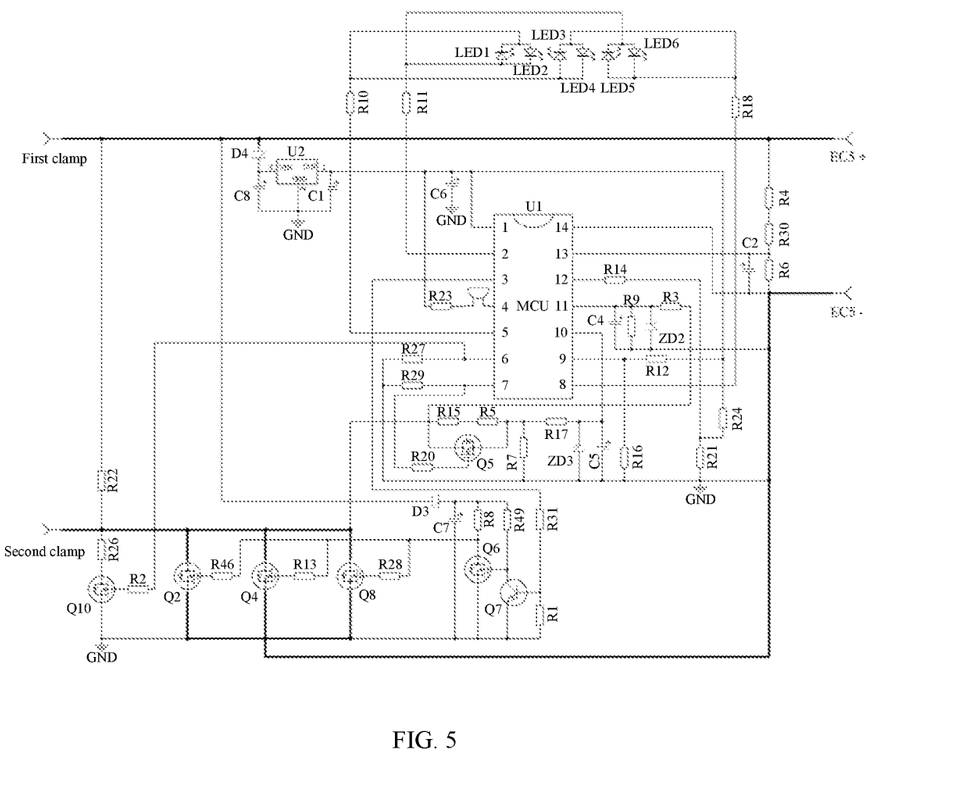
FIG. 5 is a schematic diagram showing a structure and a connection structure of the multifunctional battery health state detection device 100 in accordance with an exemplary embodiment of the invention.

FIG. 5 is a schematic diagram showing a structure and a connection structure of the multifunctional battery health state detection device 100 in accordance with an exemplary embodiment of the invention. As shown in FIG. 5, the exemplary multifunctional battery health state detection device 100 may comprise a first ignition clamp and a second ignition clamp, a microcontroller (MCU) U1, a sampling circuit, and an indicator unit. Each of the two ignition clamps are configured for connecting to a respective one of the two terminals of a vehicle battery having a positive polarity and a negative polarity.

The MCU U1 in FIG. 5 comprises 14 pins. The pin 1 of the MCU is connected to a supply power Vcc and the pin 14 is connected to ground. The pins 2, 5 and 8 are configured to connect to the indicator unit for controlling the display of the indicator lights. The pin 3 is configured to connect to an electronic switch circuit for controlling the ON and OFF of the plurality of the FETs (e.g., one of more of Q10, Q2, Q4, Q8, Q6, and Q7) in the electronic switch circuit. The pin 4 is configured to connect to a buzzer for controlling the buzzer to give alarm sound. The pins 6 and 7 are configured to connect to the sampling circuit for providing an auxiliary function of measuring an impedance of the vehicle battery. The pins 6 and 7 are further configured to connect to the electronic switch circuit for controlling the ON and OFF of the plurality of the FETs in the electronic switch circuit based on the impedance measured. The pin 9 is configured to connect to temperature measurement unit for detecting a temperature on the ignition clamps and the PCB circuit of the device. The pin 10 is configured to connect to the sampling circuit for sampling a voltage of the vehicle battery. The sampling circuit may comprise at least R15, R5, R7 and R17. ZD3 and C16 provide protection to the circuit. The pin 11 is configured to connect to a current measurement circuit and is used to measure the circuit current when the device is boosting the vehicle battery. The pin 13 is configured to connect to the portable power supply (e.g., portable battery) and is used to measure the voltage of the portable power supply (e.g., portable battery) via the interface with the portable power supply.

The sampling circuit comprises at least a plurality of resistors such as R5, R7, R15, and R17 connected between the two ignition clamps and the pin 10 of the MCU 106. The FET Q5 could be used by the MCU to calculate the impedance of the vehicle battery. A voltage regulator circuit is connected between the two ignition clamps and the MCU. The voltage regulator circuit (e.g., U2) provides power to the MCU via pin 1 and could be called as voltage regulator integrated circuit (IC).

For the details of each circuit or function above, reference may be made to relevant descriptions of the foregoing embodiments, which will not be described in detail herein for brevity.

FIG. 6 is a perspective view of a multifunctional battery health state detection device 100 provided according to an exemplary embodiment of the present invention. The device 100 shown in FIG. 6 comprises a housing 120 defining an accommodating space therein, a first ignition clamp 102 and a second ignition clamp 104 connected to the housing 120, and an indicator unit 110 mounted on the housing 120. Other circuits are included inside the housing 120 of the product and not shown in the FIG. 6. For example, a microcontroller 106 could be received in the housing 120, but it is not shown in FIG. 6. Referring to FIG. 6, the indicator unit 110 may comprise 5 indicator lights (shown in solid circle). Additionally, the indicator unit 110 may comprise one or two more indicator lights (shown in dotted circle). The indicator lights in FIG. 6 can be controlled by the MCU of the device 100 to indicate a ranking of the battery health state of the vehicle battery. Moreover, the ways of lighting the LEDs could be controlled by the MCU to indicate a successful boost, a damaged vehicle battery, etc. For example, beside only one LED is turned on, a plurality of LEDs could be turned on in a way of flow water light display, flashing, flicker, blinking, or other means. The flow water light display may create a ring in which LEDs or Lamps illuminate sequentially.

It will be appreciated that in the above embodiments the sequence numbers of the various steps do not represent an order in which these steps are performed. Actually, the order in which the various steps are performed should be determined by their functions and the intrinsic logic. Thus, the foregoing numbering will not constitute any limitation to the implementation of the various embodiments of the disclosure.

Those of ordinary skill in the art will appreciate that some or all steps of the foregoing embodiments can be implemented by hardware, or can also be implemented by instructing the relevant hardware using programs. Programs can be stored in a computer-readable storage medium, such as a read-only memory, a magnetic disk, an optical disc, etc.

Note the above embodiments are merely illustrative of the technical aspects of the disclosure and are not restrictive. Although the disclosure has been described in detail with reference to some exemplary embodiments, it will be understood by those of ordinary skill in the art that various modifications or equivalent substitutions to the technical aspects of the disclosure can be contemplated without departing from the spirit and scope of the technical solutions of the disclosure.

What is claimed is:

1. A multifunctional battery health state detection device (100) configured to identify a battery health state of a vehicle battery which is classified into a plurality of rankings, comprising:
   a housing defining an accommodating space therein;
   two ignition clamps (102, 104) connected to the housing and configured for connecting to the vehicle battery having a positive polarity and a negative polarity;
   a microcontroller (106) received in the housing;
   a sampling circuit (108) connected between the two ignition clamps (102, 104) and the microcontroller (106), the sampling circuit being configured for sampling a voltage signal of the vehicle battery when the two ignition clamp (102, 104) are connected to the vehicle battery and sending the sampled voltage signal to the microcontroller (106); and
   an indicator unit (110), connected to the microcontroller (106), comprising a plurality of indicators configured to display a ranking of the battery health state of the vehicle battery, wherein the plurality of indicators are mounted on the housing;
   wherein the microcontroller (106) is configured to obtain the sampled voltage signal of the vehicle battery, detect which ranking of the battery health state is based on the sampled voltage signal, and control the indicator unit (110) to display the battery health state according to the ranking of the battery health state, and wherein the plurality of indicators are corresponding to the plurality of rankings respectively; and
   wherein the multifunctional battery health state detection device is further configured to connect to a portable power supply, and wherein the microcontroller (106) is configured to switch on a circuit between the portable power supply and the vehicle battery to boost the vehicle battery through the two ignition clamps (102, 104) in response to detecting the battery health state being one of two lowest rankings among the plurality of rankings.

2. The multifunctional battery health state detection device of claim 1, wherein the sampling circuit (108) is further configured for sampling an impedance signal of the vehicle battery when the two ignition clamps (102, 104) are connected to the vehicle battery; and
   the microcontroller (106) is further configured to obtain the sampled impedance signal from the sampling circuit and detect the battery health state of the vehicle battery based on the sampled impedance signal.

3. The multifunctional battery health state detection device of claim 2, wherein the microcontroller (106) is configured to obtain the impedance signal of the vehicle battery when detecting the battery health state being one of the two lowest rankings, and further to detect the battery health state according to the impedance signal.

4. The multifunctional battery health state detection device of claim 3, wherein the battery health state is detected as a workable state when the impedance signal is lower than a first threshold, and the battery health state is detected as a damaged state when the impedance signal is equal or larger than the first threshold.

5. The multifunctional battery health state detection device of claim 4, further comprising a buzzer connected to the microcontroller, wherein the microcontroller controls the buzzer to provide an alarm sound in response to the damaged state.

6. The multifunctional battery health state detection device of claim 1, wherein the microcontroller (106) is configured to determine that the vehicle battery is boosted successfully when the voltage of the vehicle measured by the microcontroller is determined being above a second threshold, and provide an indication of the successful boost.

7. The multifunctional battery health state detection device of claim 1, wherein the plurality of indicators include five to seven indicator lights for displaying the ranking of the battery health state.

8. The multifunctional battery health state detection device of claim 1, further comprising an electronic switch circuit (112) connected between the two ignition clamps and the microcontroller (106), the electronic switch circuit (112) comprises a plurality of field-effect transistors (FETs) and is configured to be turned on in response to the microcontroller (106) instructing to boost the vehicle battery.

9. The multifunctional battery health state detection device of claim 1, wherein the microcontroller (106) is configured to detect at least one of: a temperature of the multifunctional battery health state detection device when the multifunctional battery health state detection device is being used, and a circuit current of the multifunctional battery health state detection device when the portable power supply is boosting the vehicle battery.

10. The multifunctional battery health state detection device of claim 9, wherein an electronic switch circuit (112) is connected between the two ignition clamps (102, 104) and the microcontroller (106) and is configured to be turned off in response to the microcontroller (106) detecting at least one of: the temperature being higher than a third threshold, and the circuit current being larger than a fourth threshold.

11. The multifunctional battery health state detection device of claim 1, wherein the plurality of rankings of the battery health state comprise a first ranking indicating "Low", a second ranking indicating "Middle", a third ranking indicating "Full", a fourth ranking indicating "Good", a fifth ranking indicating "MAX", a sixth ranking indicating "Fault".

12. The multifunctional battery health state detection device of claims 1, wherein the indicator unit comprises six indicator lights configured to connect to three pins of the microcontroller.

13. The multifunctional battery health state detection device of claims 12, wherein the indicator lights comprise a plurality of Light Emitting Diodes (LEDs), an anode of a first LED and a cathode of a second LED are connected to a second pin of the microcontroller via a first resistor (R11), a cathode of the first LED and an anode of a second LED are connected to a fifth pin of the microcontroller via a second resistor (R10), an anode of a third LED and a cathode of a fourth LED are connected to the fifth pin of the microcontroller via the second resistor (R10), a cathode of the third LED and an anode of a fourth LED are connected to a eighth pin of the microcontroller via a third resistor (R18), an anode of a fifth LED and a cathode of a sixth LED are connected to the eighth pin of the microcontroller via the third resistor (R18), a cathode of the fifth LED and an anode of a sixth LED are connected to the second pin of the microcontroller via the first resistor (R11).

14. A multifunctional battery health state detection system (200), comprising:
   a portable power supply (202); and
   a multifunctional battery health state detection device (100) according to claim 1.

15. The multifunctional battery health state detection system of claim 14, wherein the battery health state comprise a first ranking indicating "Low", a second ranking indicating "Middle", a third ranking indicating "Full", a fourth ranking indicating "Good", a fifth ranking indicating "MAX", a sixth ranking indicating "Fault".

16. The multifunctional battery health state detection system of claim 14, wherein the indicator unit comprises five to seven indicator lights for displaying the ranking of the battery health state.

17. The multifunctional battery health state detection system of claim 14, wherein the indicator unit comprises six indicator lights for displaying the ranking of the battery health state.

* * * * *